United States Patent [19]

Adams et al.

[11] 4,194,027

[45] Mar. 18, 1980

[54] METHOD OF COATING WITH HOMOGENEOUS PYROCARBON

[75] Inventors: Charles C. Adams; Curtis L. Allen; Gottfried E. A. Besenbruch, all of San Diego, Calif.

[73] Assignee: General Atomic Company, San Diego, Calif.

[21] Appl. No.: 570,223

[22] Filed: Apr. 21, 1975

[51] Int. Cl.$^2$ .................... C23C 11/00; C23C 13/00
[52] U.S. Cl. .................................... 427/249; 427/318
[58] Field of Search ................................ 427/249, 318

[56] References Cited

U.S. PATENT DOCUMENTS

| | | | |
|---|---|---|---|
| 3,317,338 | 5/1967 | Batchelor | 427/249 |
| 3,325,363 | 6/1967 | Goeddel et al. | 427/6 X |
| 3,379,555 | 4/1968 | Hough | 427/249 X |
| 3,399,969 | 9/1968 | Bokros et al. | 427/122 |
| 3,547,676 | 12/1970 | Bokros et al. | 427/213 |
| 3,677,795 | 7/1972 | Bokros et al. | 427/249 X |
| 3,799,790 | 3/1974 | Schulz et al. | 427/249 X |
| 3,912,832 | 10/1975 | Araki et al. | 427/249 X |

*Primary Examiner*—Bernard D. Pianalto
*Attorney, Agent, or Firm*—Fitch, Even & Tabin

[57] ABSTRACT

Items are coated with substantially homogeneous pyrolytic carbon by first heating them to the desired temperature, e.g., about 1200° C. to 1600° C. in a nonoxidizing atmosphere. A mixture of gas including an inert gas portion and a hydrocarbon portion is supplied to the heated enclosure at a rate so that the mixture approaches the temperature of the heated items and the hydrocarbon decomposes. The hydrocarbon portion includes between about 25 and about 60 volume percent acetylene and the remainder propylene. The exothermic characteristics of acetylene is such that the heat given off upon decomposition is sufficient to sustain the coating reaction.

11 Claims, No Drawings

METHOD OF COATING WITH HOMOGENEOUS PYROCARBON

BACKGROUND OF THE INVENTION

Pyrolytic carbon coatings have been found to be useful for a variety of applications, ranging from the provision of fission-product retentive coatings for minute nuclear fuel particles to the provision of biocompatible coatings for prosthetic device, such as heart valves, bone pins, dental implants and the like. Examples of processes for depositing pyrolytic carbon coatings are described in detail in the following U.S. patents: Goeddel et al U.S. Pat. No. 3,325,363, issued June 13, 1967; Bokros et al U.S. Pat. No. 3,399,969, issued Sept. 3, 1968; Bokros et al U.S. Pat. No. 3,526,005, issued Sept. 1, 1970; Bokros et al U.S. Pat. No. 3,547,676, issued Dec. 15, 1970; and Bokros et al U.S. Pat. No. 3,677,795, issued July 18, 1972.

Pyrolytic carbon is generally formed by thermally decomposing gaseous hydrocarbons or other carbon-containing substances in vaporous form. The desired end product of the coating operation is usually the composite coated object; however, in some instances a mandrel or other substrate may be coated which is subsequently removed, as for example by machining, to leave the resultant pyrolytic carbon structure as the end product.

The above-mentioned patents specifically describe various pyrolytic carbon-deposition processes wherein a mixture of a hydrocarbon and an inert gas, for example argon or helium, is employed at atmospheric pressure and temperatures in the general range from about 800° C. to about 2200° C. The density and crystalline characteristics of the pyrolytic carbon is dependent upon a number of factors including hydrocarbon composition, temperature, availability of deposition surface, flow rate through the coating enclosure, and the like, as described in detail in the aforementioned patents.

In the usual coating operation, the articles to be coated are first brought up to the desired coating temperature, generally using inductive or resistive electrical heating, while flowing an inert gaseous atmosphere through the coating enclosure. After the desired temperature is reached, a vaporous hydrocarbon is added to the gaseous atmosphere, and its decomposition and carbon deposition begin. However, a quantum of heat is required to raise the hydrocarbon vapor to the desired temperature in the coating enclosure, and sometimes also to effect its decomposition, and oftentimes the absorption of heat causes a downward temperature excursion to occur, which must then restabilize itself. Because the temperature has a significant effect upon the density and the crystalline structure of the pyrolytic carbon deposited, some heterogeneity in the carbon coating results from such temperature excursions.

SUMMARY OF THE INVENTION

Improved methods for depositing substantially homogeneous pyrolytic carbon have been found. By careful selection and proportioning of a hydrocarbon mixture, the total quantum of heat required to raise the temperature of a hydrocarbon mixture can be supplied by an amount of heat output that is obtainable by employing a hydrocarbon mixture that decomposes exothermically. By balancing the heat input requirements of the hydrocarbon portion of the mixture against the heat output from the decomposition thereof, there is a total elimination of the dynamically changing situation previously encountered in the coating enclosure, and as a result, the pyrolytic carbon deposited is substantially homogeneous. Successful results have been obtained by employing a mixture of acetylene and propylene as the source of the pyrocarbon deposited.

DESCRIPTION OF THE PREFERRED EMBODIMENTS

Generally, any suitable type of coating apparatus may be employed; however, if the objects being coated are relatively small particles, or larger objects being coated in association with an ancillary group of small particles, (i.e., to provide additional available deposition surface area as discussed in the aforementioned patents), coaters are employed which will maintain these particles in motion. Examples of such coaters include rotating drums and fluidized bed coaters, and the latter is preferred. For convenience in description, all reference is hereinafter made to a fluidized bed coater.

In a fluidized bed coating apparatus, a bed of particles is maintained within a desired region or enclosure, which is heated to a desired temperature, by levitating the particles in an upward flowing gas stream. A suitable nonreactive gas, for example, helium, argon or nitrogen, is generally used to levitate the particles during the period when they are being heated to the desired deposition temperature. Even if particles are not being levitated, the initial heating of the items to be coated would generally take place in such a nonreactive atmosphere. Thereafter, depending upon the desired density and crystalline characteristics of the pyrolytic carbon, the gaseous atmosphere which is supplied to the enclosure will usually continue to include a significant portion of this nonreactive, fluidizing gas.

The flow rate of the gas mixture is set so that the particles are levitated but remain within the heated region of the coating enclosure (assuming that particles are employed) and furthermore so that a major portion of the hydrocarbon gas decomposes within the coating enclosure, as opposed to being carried out with the exit stream in unreacted state. In this respect, 90 mole percent of the hydrocarbon should be decomposed, and preferably from an economic standpoint, at least 99 percent is pyrolyzed to leave the carbon deposit within the heated coating enclosure. Of course, in the preferred coating apparatus, i.e., a fluidized bed, the flow rate of the gaseous mixture must be sufficient to levitate the small particles.

The invention is considered to be particularly advantageous in coating minute nuclear fuel particles wherein homogeneity in carbon characteristics can be maintained throughout the total thickness of the pyrocarbon jacket. As a result of such homogeneity, there is less likelihood of creating stresses during the life of the particles in a nuclear reactor. Fuel particle cores will usually be spheroids of a size less than two millimeters, and most often the fuel cores will be less than 1000 microns in size. When it is desired to coat larger objects, such objects can oftentimes be included in the enclosure with the bed of particles and levitated along with them. However, in the case of objects of a size too large to be reasonably levitated, a suitable support can be used to suspend such objects in the fluidized bed.

Although the invention can be used to deposit pyrolytic carbon having different crystalline characteristics, for example, isotropic, laminar and sooty carbon, from the standpoint of coating nuclear fuel particles, the deposition of homogeneous isotropic pyrolytic carbon is considered to have the greatest advantage. Isotropic carbon may be defind as a carbon structure which possesses very little preferred orientation, has a broad range of apparent crystallite sizes and has a density that may vary from about 1.4 to about 2.2 g/cm$^3$. The microstructure of isotropic carbon, when viewed metallographically under polarized light, is not optically active but is featureless.

The determination of whether a carbon structure is isotropic or anisotropic can be made using X-ray diffraction, from which the variations in the intensity of the X-rays diffracted from the layer planes may be used to calculate its Bacon Anisotropy Factor (BAF). The BAF is an accepted measure of preferred orientation of the layer planes in a carbon structure. The technique of measurement and a complete explanation of the scale of measurement is set forth in an article by G. E. Bacon entitled "A Method for Determining the Degree of Orientation of Graphite", which appeared in the Journal of Applied Chemistry, Volume VI, Page 477 (1956). Generally, the term isotropic carbon is used to refer to carbon measuring between 1.0 and about 1.3 on the Bacon scale.

One of the criteria that determines whether isotropic pyrolytic carbon is deposited is the relative amount of deposition surface area present. As a general rule, when a relatively large amount of surface area is present, per unit of void volume within the coating enclosure deposition region, the carbon deposited will be isotropic. This relationship is set forth in more detail in the aforementioned patents, and in general, it is considered that the ratio of the available surface area (expressed, for example, in square centimeters) to the void volume in the deposition region (correspondingly expressed in cubic centimeters) should be at least about 3 to 1 and preferably at least about 5 to 1.

It will be realized that the flow rate of the gaseous mixture will differ for different-sized coating apparatus to achieve the same effect. The larger the coating enclosure, the greater the flow rate of the gaseous mixture will be required in order to achieve the same relative effect within the deposition region. Accordingly, one method of expression of the flow rate which removes the size of the coater as a variable is a parameter called "contact time", which is equal to the volume of the deposition region divided by the measured rate of total gas flow (adjusted for temperature). The deposition region in a fluidized bed coater is equal to the height times the average cross sectional area, and the flow rate will usually be measured at room temperature and can then be adjusted to the temperature at which deposition is occurring. Generally, a contact time of about 0.1 to about 0.2 seconds will be employed; however, contact times may vary up to about 1 second depending upon the relative percentages of the gaseous fractions of the coating mixture, the temperature and the precise crystalline characteristics of the carbon being deposited.

From the standpoint of depositing isotropic pyrolytic carbon, operation will usually be carried out at a temperature between about 1200° C. and about 1600° C. If it is desired to deposit pyrolytic carbon having other characteristics, for example, laminar carbon, temperatures between about 1000° C. and 2000° C. may be used and/or other of the parameters may also be shifted. Within a particular temperature range, varying the temperature will have an effect upon the final density of the pyrolytic carbon as taught in the aforementioned U.S. patents, and the temperature is chosen to achieve the desired density using the gaseous mixture of the invention.

It has been found that by employing a mixture of acetylene and propylene, isotropic pyrolytic carbon can be deposited under conditions wherein the heat given off by the hydrocarbons upon decomposition is sufficient to raise the temperature of the incoming gaseous mixture from room temperature to the desired coating temperature so that substantially steady-state conditions can be achieved and further input of heat is not needed. In this respect, both acetylene and propylene have an enthalpy which is positive, and accordingly there is a net heat input equal to these enthalpies when decomposition occurs. Balanced against the net heat input is the amount of heat required to raise the mixture of acetylene and propylene to the desired coating temperature. It is generally considered desirable that preheating of the gaseous hydrocarbons is avoided; however, there is no reason why preheating may not be employed.

It has been found that the gaseous hydrocarbons can be fed to the coating apparatus at substantially room temperature and can be raised to the coating temperature by the heat input from the positive enthalpies alone. In general, the amount of heat given off by the decomposition of propylene will not be sufficient to balance the amount of heat required to raise its temperature to the desired level; however, the greater enthalpy of acetylene is sufficient not only to raise acetylene to the desired temperature, but also to make up the difference with respect to propylene.

It is often possible to heat the items to be coated to the desired temperature while passing the nonreactive gas through the enclosure at the ultimate flow rate at which this gas fraction will be used in the coating process. Then, when the items to be coated have reached this temperature and the desired amount of the hydrocarbon mixture is added to the nonreactive gas, the only change occurring will be the need to raise the hydrocarbon portion to the desired temperature, i.e., because the heater will already be operating to sufficiently heat the nonreactive gas and to account for the radiation losses to the surrounding atmosphere in achieving equilibrium. As a result, the coating apparatus will continue to operate at nearly the same power level, assuming electric resistance or induction heating, at which it was operating prior to introduction of the hydrocarbon. As a result, savings in power costs of 40 to 50% can be effected, and even greater power savings are possible as indicated immediately hereinafter.

Alternatively, instead of relying upon electricity or other energy to continue to supply the heat necessary to raise the nonreactive gas to the deposition temperature (and also that heat to make-up for radiation losses), it is possible to adjust the acetylene-propylene mixture so that the acetylene fraction is sufficiently high that the additional heat available from the enthalpy of the acetylene provides substantially all of the heat input needed for the coater to operate. However, the use of a significantly higher proportion of acetylene could also change the character of the carbon being deposited and should be taken into consideration. When this alternative is used, once the coating operation begins, the power supply is substantially no longer needed, and the coating reaction simply proceeds, maintaining equilibrium, without the further application of any heat. Upon reaching the desired thickness of coating, the supply of hydrocarbon is simply terminated, and the particles are allowed to cool down and approach room temperature in the nonreactive gas stream.

To achieve the desired temperature balance, acetylene should constitute between about 25 and about 65 volume percent of the hydrocarbon portion with the remainder being propylene. Preferably, acetylene accounts for between about 50 and about 55 percent of the total hydrocarbon, and the coating operation is carried out at about atmospheric pressure. It is usual that the nonreactive gas (e.g., argon) should constitute between about 20 and about 65 volume percent of the overall mixture which is supplied during the coating operation, and preferably, the amount of nonreactive gas is maintained at a level between about 35 and about 45 volume percent. The above-indicated preferred ranges are considered applicable to the temperature range of about 1250° C. to about 1420° C., and these percentages might vary slightly if other coating temperatures outside are used.

Using such an acetylene-propylene mixture, isotropic pyrolytic carbon having a density between about 1.7 and about 2.0 g/cm$^3$ can be deposited. Moreover, pyrocarbon in the preferred range of 1.75 to 1.95 g/cm$^3$ can be deposited over a fairly broad temperature range, i.e., between about 1250° C. and about 1375° C. Previously, when a single gas, e.g., propylene, was used, a narrower and slightly higher temperature range, i.e., between about 1375° C. and 1435° C. was considered desirable.

Whereas previously when a single hydrocarbon (e.g., propylene) was employed as the source of isotropic carbon in the pyrolytic carbon coating operations, upon initial addition of the hydrocarbon to the fluidizing gas stream being supplied to the coating apparatus, there was an initial temperature drop which caused carbon to be first deposited at a lower temperature. After this temperature drop had been noticed by the instrumentation, the electric power supply would be caused to return the coater temperature to the desired level. However, inherent in nearly all instrumentation is some initial lag in time until the lower temperature would be registered, and thereafter some temperature overrun occurs after power is removed from the heater. As in any thermostatic control situation, this slight lag and slight overrun would be repeated each time power to the heater is turned on or off. As a result of such changes in temperature, corresponding changes were reflected in the density and the crystallinity of the pyrolytic carbon, and heterogeneity could be discerned. Such changes in the carbon characteristics can give rise to the creation of stresses during the life of these coated fuel particles in nuclear reactors, and such stresses substantially increase the likelihood of rupture of the fuel particle coatings during their lifetime in a reactor core. This potential problem is eliminated by the present invention. Moreover, elimination of such an initial temperature depression and subsequent smaller temperature excursions inherent in instrumentation allows higher coating rates to be achieved, i.e., 3 microns or more a minute, without sacrificing uniformity in carbon characteristics.

The following Examples illustrate processes for producing pyrolytic carbon coatings which reflect various advantages of the invention. Although these Examples include the best modes presently contemplated by the inventors for carrying out their invention, it should be understood that these Examples are only illustrative and do not constitute limitations upon the invention which is defined solely by the claims which appear at the end of this specification.

EXAMPLE I

A two-kilogram charge of thorium dioxide spheroidal particles is prepared having an average size of about 500 microns. A coating apparatus is employed utilizing a graphite furnace tube having an interior diameter of about 12.7 centimeters. An upward flow of argon is established through the coater at a rate of about 125 liters per minute. The two kg. charge of particles is fed into the coater, and electrical power is supplied to a resistance heating element to bring the graphite tube and the particles to a temperature of about 1495° C., over a height of about 10 centimeters which constitutes the deposition region. When equilibrium conditions are reached, acetylene is added to the argon in an amount of about 100 liters per minute (combined gas-flow rate of about 225 liters per minute) and is continued for about four minutes during which time an 85-micron thick buffer layer of relatively low density, spongy pyrolytic carbon is deposited.

Next, the temperature is lowered to about 1180° C. while the aforestated flow of argon is continued. When this temperature is reached, a minor amount of propylene is added to the argon, in the amount of about 6 liters per minute. The propylene addition is continued for about twelve minutes and is then terminated. As a result, a thin, dense seal layer of laminar carbon, about 5 microns thick and having a density of about 2.0 g/cm$^3$, is deposited atop the spongy buffer layer.

Following deposition of the seal layer, the temperature is raised to about 1300° C. while maintaining the same argon flow rate. After the charge of coated particles reaches equilibrium at this temperature, about 50 liters per minute flow of a hydrocarbon mixture containing about 54 volume percent acetylene and about 46 volume percent propylene is added to the 100 l./min. flow of argon. Deposition of isotropic pyrolytic carbon begins and is continued for about 15 minutes. At the end of this time, the particles are allowed to cool to approach room temperature in the argon, and thereafter they are emptied from the coater and examined.

Examination shows that the outermost layers consist of substantially homogeneous isotropic carbon having a BAF of about 1.02, and a density of about 1.85 g/cm$^3$ and a uniform crystallite size of about 40 Å. Irradiation of the coated particles at an average fuel temperature of about 1200° C. is carried out to test the particles under simulated in-reactor conditions. The performance of these particles is excellent, and the particles are considered to be well-suited for use in nuclear reactor operations.

EXAMPLE II

A coating run similar to that described in Example I is repeated on a larger scale using a fluidized bed coater having a graphite tube with a 24 centimeter inner diameter. An approximately 20 kilogram charge of the same thorium oxide particles is heated to a temperature of about 1360° C. in a flow of argon equal to about 565 liters per minute. Addition of about 335 l./min. of acetylene and coating under these conditions for about fifteen minutes deposits an 85-micron thick spongy buffer layer of pyrolytic carbon having a density of about 1.1 g/cm$^3$. The temperature is then lowered to about 1150° C., and the argon flow rate is increased to about 820 liters per minute. About 55 liters per minute of propylene is added to the argon, and coating for about ten minutes deposits a seal layer of pyrolytic carbon about 5 microns thick and having a density of about 2.0 g/cm$^3$.

The bed temperature is then raised to about 1300° C., and the argon flow rate is lowered to about 600 liters per minute. A flow of about 650 liters per minute of a mixture of about 54 volume percent acetylene and 46 volume percent of propylene is then added to the argon. Coating for about 15 minutes produces a coating of pyrocarbon about 75 microns thick. After cooling in the argon flow, examination of these particles shows an isotropic pyrolytic carbon surrounding the seal layer which has a density of about 1.85 g/cm$^3$, an isotrophy of about 1.02 on the Bacon scale and a uniform crystallite size of about 40 Å. Metallographic examination shows that the isotropic outer layer is substantially homogeneous throughout its entire thickness. Testing in accordance with Example I shows that the particles are considered to be excellently suited for use in nuclear reactors.

The invention provides pyrolytic carbon coatings which, as a result of their substantial homogeneity have improved mechanical properties and improved stability under fast neutron irradiation. Moreover, the invention provides a process for the deposition of pyrolytic carbon which is capable of operation with significantly reduced power input (and under some circumstances with elimination of nearly all power during coating), and in the case of a large-scale fuel fabrication operation, the savings in power can be of considerable advantage.

Although the invention has been described with regard to certain preferred embodiments, it should be understood that modifications can be made as would be obvious to one having the ordinary skill in this art without deviating from the scope of the invention which is set forth solely in the appended claims. Various features of the invention are set forth in the claims which follow.

What is claimed is:

1. A method of coating items with substantially homogeneous pyrolytic carbon, which method comprises heating the items to be coated to a temperature of between about 1000° C. and about 2000° C. in an enclosure and flowing a mixture of gases through said enclosure at a rate so that said gases are heated to a temperature approaching the temperature of said items causing gaseous decomposition and deposition of pyrolytic carbon, said mixture containing an inert gas portion and a hydrocarbon portion, said hydrocarbon portion including between about 25 v/o and about 65 v/o of acetylene and the remainder of propylene, said mixture composition being such that the amount of heat needed to raise said gaseous mixture from the temperature at which it enters the enclosure to said decomposition temperature is approximately balanced against the heat given off by the hydrocarbon decomposition.

2. A method of coating in accordance with claim 1 wherein at least about 90 mole percent of said hydrocarbon is decomposed.

3. A method of coating in accordance with claim 1 wherein said hydrocarbon includes between about 50 and about 55 volume percent acetylene.

4. A method in accordance with claim 1 wherein said items are heated to a temperature between about 1200° C. and about 1600° C.

5. A method in accordance with claim 1 wherein a sufficient quantity of small particles are present in said enclosure to cause isotropic pyrocarbon to be deposited.

6. A method in accordance with claim 5 wherein said enclosure is a part of a fluidized bed apparatus and wherein the flow rate of said gaseous mixture is sufficient to levitate said particles.

7. A method in accordance with claim 5 wherein said carbon has a density of between about 1.7 and about 2 grams per cm$^3$.

8. A method in accordance with claim 7 wherein said coating is carried out at about atmospheric pressure.

9. A method in accordance with claim 8 wherein said inert gas constitutes between about 20 v/o and about 65 v/o of said mixture.

10. A method in accordance with claim 7 wherein said isotropic carbon is deposited at a rate of at least about 3 microns per minute.

11. A method in accordance with claim 1 wherein said inert gas constitutes between about 35 and about 45 volume percent of said mixture.

* * * * *